US006867491B2

(12) United States Patent
Guzek et al.

(10) Patent No.: US 6,867,491 B2
(45) Date of Patent: Mar. 15, 2005

(54) METAL CORE INTEGRATED CIRCUIT PACKAGE WITH ELECTRICALLY ISOLATED REGIONS AND ASSOCIATED METHODS

(75) Inventors: John Guzek, Chandler, AZ (US); Dustin Wood, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 10/033,880

(22) Filed: Dec. 19, 2001

(65) Prior Publication Data

US 2003/0111710 A1 Jun. 19, 2003

(51) Int. Cl.[7] .............................................. H01L 23/04
(52) U.S. Cl. ...................... 257/698; 257/700; 257/708; 257/758; 257/774; 438/106; 438/121
(58) Field of Search .............................. 257/698, 700, 257/708, 758, 774, 691, 678; 438/106, 121, 622, 625, 668; 174/250, 255–260, 262, 263, 264, 265; 361/780–784; 29/852, 830, 832, 840

(56) References Cited

U.S. PATENT DOCUMENTS

| 4,769,270 | A | * | 9/1988 | Nagamatsu et al. | 428/131 |
|---|---|---|---|---|---|
| 5,014,159 | A | * | 5/1991 | Butt | 361/717 |
| 5,672,911 | A | * | 9/1997 | Patil et al. | 257/691 |
| 6,085,415 | A | * | 7/2000 | Gandhi et al. | 29/852 |
| 6,097,089 | A | * | 8/2000 | Gaku et al. | 257/712 |
| 6,121,827 | A | * | 9/2000 | Khoini-Poorfard et al. | 327/565 |
| 6,131,278 | A | * | 10/2000 | MacQuarrie et al. | 29/840 |
| 6,248,959 | B1 | * | 6/2001 | Sylvester | 174/256 |
| 6,344,371 | B2 | * | 2/2002 | Fischer et al. | 438/106 |
| 6,432,724 | B1 | * | 8/2002 | Ahn et al. | 438/667 |
| 6,518,502 | B2 | * | 2/2003 | Hammond et al. | 174/52.4 |
| 2002/0030272 | A1 | * | 3/2002 | Murata | 257/734 |
| 2002/0038908 | A1 | * | 4/2002 | Ding et al. | 257/720 |

\* cited by examiner

*Primary Examiner*—David Nelms
*Assistant Examiner*—Long Tran
(74) *Attorney, Agent, or Firm*—David L. Guglielmi

(57) ABSTRACT

An integrated circuit chip package having a metal substrate core having two or more electrically isolated regions, wherein the electrically isolated regions of the metal substrate core may be coupled with voltage rails of an integrated circuit chip.

4 Claims, 3 Drawing Sheets

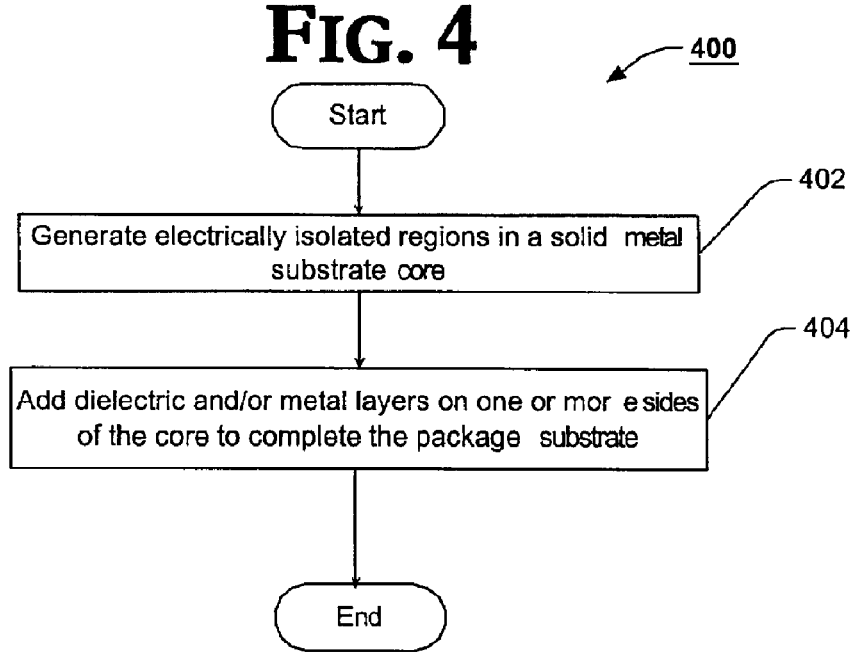
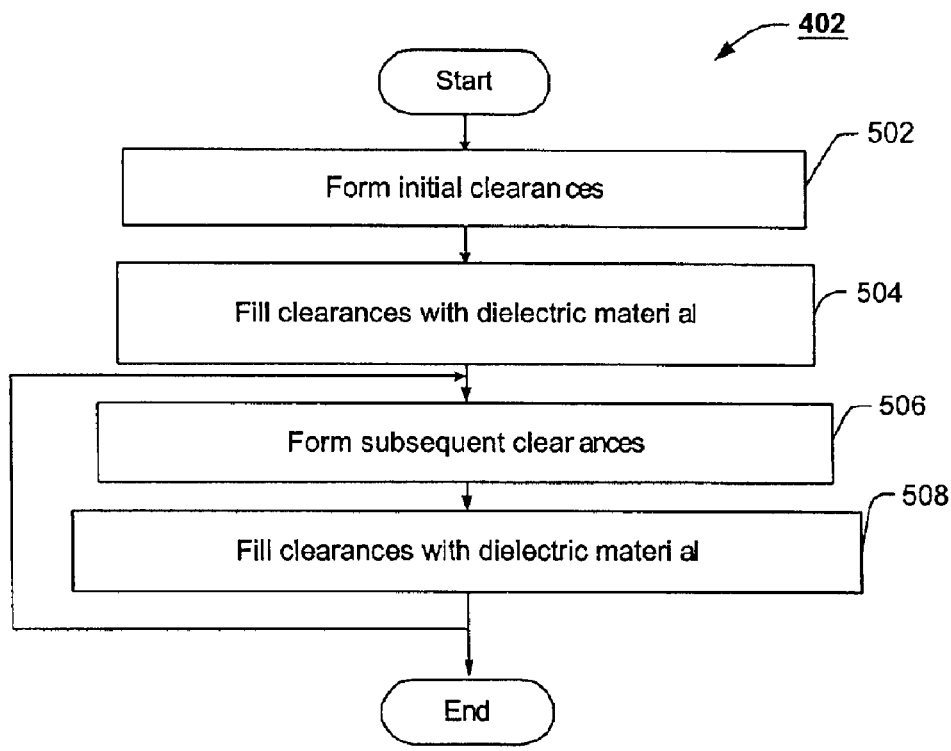

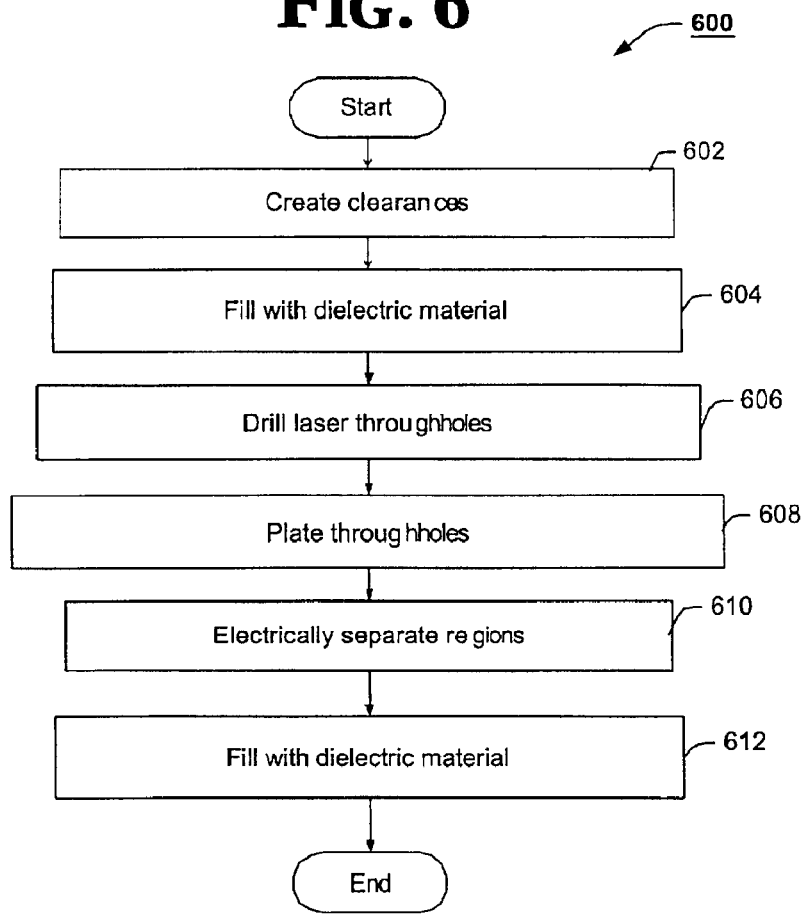
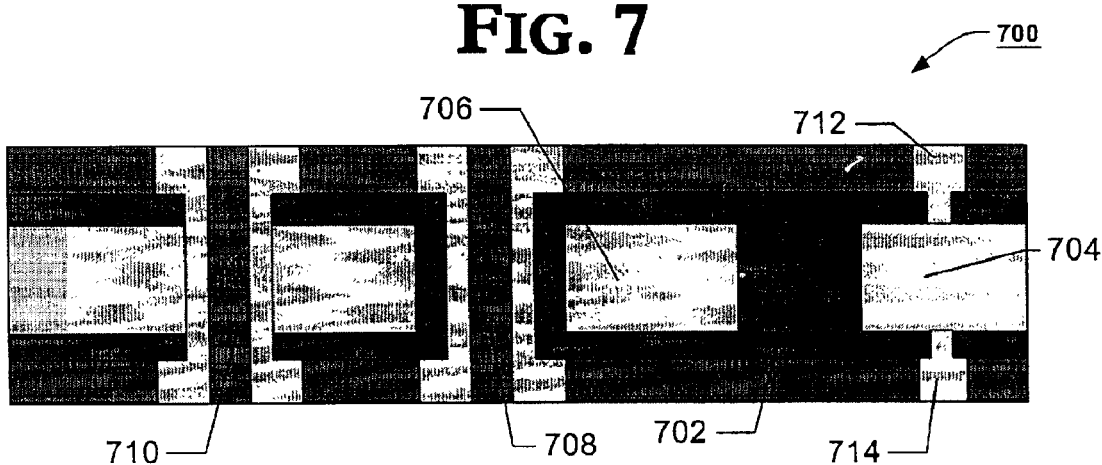

METAL CORE INTEGRATED CIRCUIT PACKAGE WITH ELECTRICALLY ISOLATED REGIONS AND ASSOCIATED METHODS

FIELD OF THE INVENTION

The invention relates to the field of Integrated Circuit (IC) chip packages. More particularly, the invention relates to a metal core integrated circuit package with electrically isolated regions.

BACKGROUND OF THE INVENTION

With the increasing power demands of integrated circuit (IC) chips, there exists a need for IC chip packages to be designed for greater power delivery. Economics dictate that the cost of such packages be as low as possible while still delivering the necessary power to the IC chip and maintaining input/output (I/O) signal quality.

Conventional IC package substrates are made with a solid non-conducting core. FIG. 1 illustrates an example of just such a conventional IC package substrate. Core 102 is made up of a dielectric material, typically fiberglass. Since this material is nonconductive, it offers no electrical benefit for power delivery. Voltage rails (i.e., power and ground) and I/O signals are routed through plated holes, commonly referred to as "vias", in the core. Metal layers 104 and 106 are disposed on either side of the core and can provide power or ground wells. Additional dielectric layers 108 and 110 insulate the metal layers from one another. In this case, as the power demands of the IC rise, it may be necessary to add more and more layers to the substrate in order to provide ample power and grounding to support such increased demands.

In contrast, FIG. 2 illustrates an example of an IC package substrate with a metal core 202 as taught by U.S. Pat. No. 5,847,327 issued Dec. 8, 1998 to Fischer et al. and entitled "DIMENSIONALLY STABLE CORE FOR USE IN HIGH DENSITY CHIP PACKAGES." By coupling the metal core with a voltage rail, it is possible to leverage the electrical properties of the metal core and eliminate one or more of the metal layers that were needed as in FIG. 1. The core 202 is insulated with dielectric layers 204 and 206, which are typically made of an epoxy.

One of the limitations of the Fischer core 202 is that it is but a single continuous piece of metal. Accordingly, it is only possible to couple it to a single voltage rail. Other voltage rails may be coupled with additional metal layers 208 and 210.

BRIEF DESCRIPTION OF THE DRAWINGS

The present invention is illustrated by way of example, and not by way of limitation, in the figures of the accompanying drawings in which like reference numerals refer to similar elements and in which:

FIG. 4 is a flow chart of an example method for generating a package substrate in accordance with the teachings of the present invention.

FIG. 5 is a flow chart of an example method for generating electrically isolated regions in a metal substrate core in accordance with the teachings of the present invention.

FIG. 6 is a flow chart of an example method for generating an IC package substrate in accordance with the teachings of the present invention.

FIG. 7 is a graphical illustration of a cross-sectional view of an example of a metal core based IC package substrate in accordance with the teachings of the present invention.

DETAILED DESCRIPTION

The present invention is generally directed to a metal core based IC package substrate with electrically isolated regions and associated methods. In the following description, for purposes of explanation, numerous specific details are set forth in order to provide a thorough understanding of the invention. It will be apparent, however, to one skilled in the art that the invention can be practiced without these specific details. In other instances, materials and methods are shown in graphical illustrations in order to avoid obscuring the invention.

In accordance with the present invention, multiple electrically isolated regions in a metal substrate core are further coupled with multiple voltage rails. Those skilled in the art will appreciate that this has the potential to eliminate the need for power and ground wells in metal layers other than the core, thereby reducing the total number of metal layers required in the substrate. In accordance with another aspect of the present invention, an electrically isolated region of a metal substrate core is coupled with a digital ground of an IC chip. Those skilled in the art will appreciate that this can enhance signal quality by providing a reference region through which input/output (I/O) signals can be routed.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
FIG. 1 is graphical illustration of a cross-sectional view of a current organic core based IC package substrate.
Figure 2:
FIG. 2 is a graphical illustration of a cross-sectional view of a metal core based IC package substrate for use with the invention.
Figure 3:
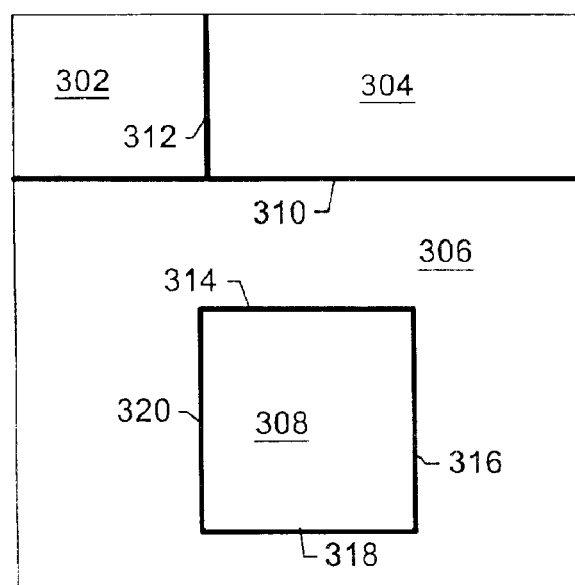
FIG. 3 is graphical illustration of an overhead view of an example of a metal substrate core with electrically isolated regions in accordance with the teachings of the present invention.

FIG. 3 is graphical illustration of an overhead view of an example of a metal substrate core with electrically isolated. The regions 302, 304, 306, and 308 are all electrically isolated from one another. It should be clear to one skilled in the art that electrically isolated regions can be any shape or size. As the example in FIG. 3 illustrates, regions can border the edge of the substrate and/or one or more other electrically isolated regions. Demarcation lines 310, 312, 314, 316, 318, and 320 denote clearances that are iteratively formed in the metal substrate core and subsequently filled with dielectric material, as will be discussed in greater detail below. In this example, demarcation lines 310 and 312 electrically isolate regions 302, 304, and 306 from one another. Demarcation lines 314, 316, 318, and 320 electrically isolate regions 306 and 308 from each other.

FIG. 4 provides a flow chart of an example method for generating an IC package substrate. Electrically isolated regions are generated (402) within the metal substrate core. Subsequently, any additional dielectric and/or metal layers that are needed are iteratively built (404) onto the substrate core until the substrate is complete. A detailed example method for generating the substrate core is presented more fully with reference to FIG. 6.

FIG. 5 is a flow chart of an example method (402) for generating electrically isolated regions in a metal substrate core. Clearances are formed (502) through the metal substrate core along demarcation lines. In accordance with this implementation, these clearances partially separate the two or more regions of the substrate core, leaving some metal connecting the regions for mechanical stability. Those skilled in the art will appreciate that the clearances may be generated by any of a number of manufacturing processes. In accordance with one embodiment, the clearances are generated through chemical etching, while in other embodiments the clearances are generated through laser ablating, mechanical methods, and other methods for creating clearances in metal. One skilled in the art can appreciate that step 502 may be combined with other methods of substrate generation as is presented with reference to FIG. 6.

Then, the clearances formed in step 502 are filled (504) with dielectric material. This dielectric material can be an epoxy that has the insulating properties to ensure that the metal core regions on either side of the dielectric will be electrically isolated.

Subsequent clearances are formed (506) in the metal substrate core along the demarcation lines that may fully electrically separate two or more regions of the core. In one embodiment, the clearances are formed along the same demarcation lines as in step 502 removing the last of the metal connections between regions that are to be electrically isolated. In one embodiment, mechanical drilling is used to remove the metal connections, while in other embodiments other methods of clearance formation are utilized.

The clearances formed in step 506 are filled with dielectric material (508). In one embodiment, the dielectric material is the same type of epoxy used in step 504. Steps 506 and 508 are then repeated, if necessary, to completely electrically isolate additional regions of the metal substrate core.

FIG. 6 is a flow chart of a detailed example method for generating an IC package substrate. The method begins with step 602 wherein clearances are formed. These clearances can include the clearances formed in step 502 that partially separate regions of the core that are to be electrically isolated from one another. Clearances are also formed for throughholes that are not to be coupled with the metal core.

Dielectric material fills (604) the clearances formed in step 602 much the same as in step 504.

Laser throughholes are drilled (606). A laser throughhole can be drilled through the clearances that were formed in step 602 and subsequently filled with dielectric material in step 604. In this way the laser throughhole does not contact the metal core. Alternatively, the laser throughhole can be drilled directly through the metal core. In this way, a region of the metal core can be coupled with a voltage rail (i.e., power, ground, etc.) of a subsequently mounted IC chip. If the metal core is too thick to be laser drilled, a region of the core can be coupled with a voltage rail by other means. In one embodiment, laser drilling is used to create holes through the dielectric material on either side of a region of the metal core. The resulting holes are then filled with metal. These metal connections are commonly referred to as "micro-vias."

The laser throughholes drilled in step 606 are plated (608) with metal, which electrically couples one element of the substrate with another element. In one embodiment, solder bumps of an IC chip on one side of the substrate are coupled with pins to connect the package to a socket on the other side of the substrate.

Subsequent clearances are formed (610) through the substrate that may fully electrically separate two or more regions of the metal substrate core as in step 506.

Dielectric material fills (612) the clearances formed in step 610 and plugs the plated laser throughholes formed through steps 606 and 608.

FIG. 7 is a graphical illustration of a cross-sectional view of an example of a metal core based IC package substrate. Clearance 702 is part of a larger clearance along a demarcation line that electrically isolates two or more regions of the metal core. In this example, clearance 702 electrically isolates metal core regions 704 and 706 from each other. It may have been formed at the same time that a clearance was formed for plated throughhole (PTH), a type of via, 708 as in step 602. The clearance for PTH 708 was then filled with dielectric material as in step 604. Laser drilling then created the throughhole as in step 606, which was subsequently plated and plugged as in steps 608 and 612, respectively.

PTH 710 was created by laser drilling through the metal core itself as opposed to through a clearance in the core. Because of its direct connection to metal core region 706, PTH 710 can be used to couple a digital ground or other voltage rail of an IC chip with metal core region 706. By coupling metal core region 706 with a digital ground of an IC chip, it is possible to provide a reference for an I/O signal that may be routed by PTH 708 and thus maintain good signal quality.

Micro-vias 712 and 714 can be used to couple a metal core region (704) with a voltage rail. Laser drilling as in step 606 may have been utilized to create holes in the dielectric material on either side of the metal core. These holes were then filled with metal as in step 608.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in step diagram form.

The present invention may be part of any IC chip package. The IC chips that utilize such a package may include, but are not limited to, microprocessors, chipsets, graphics or I/O controllers, communication controllers, FPGA's, memory chips, or other types of IC chips.

Many of the methods are described in their most basic form but steps can be added to or deleted from any of the methods without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

What is claimed is:

1. An integrated circuit chip package comprising:

a metal substrate core;

the metal substrate core having at least two electrically isolated regions;

wherein at least one of the electrically isolated regions of the metal substrate core is coupled with a digital around of an integrated circuit chip, wherein input and output signals of the integrated circuit chip are routed through the electrically isolated region of the metal substrate core that is coupled with the digital ground of the integrated circuit chip, and wherein at least one of the electrically isolated regions of the metal substrate core is coupled with an operating voltage rail of the integrated circuit chip.

2. The integrated circuit chip package of claim 1, wherein at least one of the electrically isolated regions of the metal substrate core is coupled with an analog ground of the integrated circuit chip.

3. An integrated circuit chip package comprising:
- a metal substrate core;
- the metal substrate core having at least three electrically isolated regions;
- wherein at least one of the electrically isolated regions of the metal substrate core is coupled with a digital around of an integrated circuit chip and through this region input and output signals are routed, and wherein at least one of the electrically isolated regions of the metal substrate core is coupled with an operating voltage rail of the integrated circuit chip.

4. The integrated circuit chip package of claim 3, wherein at least one of the electrically isolated regions of the metal substrate core is coupled with an analog ground of the integrated circuit chip.

* * * * *

UNITED STATES PATENT AND TRADEMARK OFFICE
CERTIFICATE OF CORRECTION

PATENT NO. : 6,867,491 B2
DATED : March 15, 2005
INVENTOR(S) : Guzek et al.

It is certified that error appears in the above-identified patent and that said Letters Patent is hereby corrected as shown below:

<u>Column 4,</u>
Line 57, delete "around" and insert -- ground --.

<u>Column 5,</u>
Line 8, delete "around" and insert -- ground --.

Signed and Sealed this

Twenty-fourth Day of May, 2005

JON W. DUDAS
*Director of the United States Patent and Trademark Office*